United States Patent
Zargham et al.

(10) Patent No.: US 9,621,166 B1
(45) Date of Patent: Apr. 11, 2017

(54) WIDE FREQUENCY/VOLTAGE-RATIO BUFFER WITH ADAPTIVE POWER CONSUMPTION

(71) Applicant: QUALCOMM Incorporated, San Diego, CA (US)

(72) Inventors: Mohammad Meysam Zargham, San Diego, CA (US); Masoud Roham, San Diego, CA (US); Liang Dai, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/862,473

(22) Filed: Sep. 23, 2015

(51) Int. Cl.
   *H03K 19/0185* (2006.01)

(52) U.S. Cl.
   CPC .............. *H03K 19/018528* (2013.01)

(58) Field of Classification Search
   CPC ..... G06F 1/00; G06F 1/04; G06F 1/08; G06F 1/10; G11C 7/00; G11C 7/22; H03K 19/00; H03K 19/018528; H03K 5/00; H03K 5/135
   USPC ......................................................... 327/291
   See application file for complete search history.

(56) References Cited

U.S. PATENT DOCUMENTS

| | | | |
|---|---|---|---|
| 5,175,512 A * | 12/1992 | Self | H03K 3/011 326/81 |
| 5,912,574 A | 6/1999 | Bhagwan | |
| 6,285,214 B1 | 9/2001 | Zipper | |
| 6,414,556 B1 | 7/2002 | Mizuno | |
| 6,552,579 B1 * | 4/2003 | Knoedgen | G01R 19/0092 327/101 |
| 7,965,145 B2 | 6/2011 | Kim et al. | |
| 8,134,417 B2 | 3/2012 | Chiang et al. | |
| 8,736,385 B2 | 5/2014 | Chalamala et al. | |
| 2002/0075087 A1 | 6/2002 | Talbot | |
| 2012/0154045 A1 * | 6/2012 | Tsai | H03F 3/3022 330/253 |

FOREIGN PATENT DOCUMENTS

EP    0661809 A1    7/1995

OTHER PUBLICATIONS

Kinget P., "Integrated GHz Voltage Controlled Oscillators," Analog Circuit Design, 1999, pp. 353-381.
International Search Report and Written Opinion—PCT/US2016/048134—ISA/EPO—Nov. 22, 2016.

* cited by examiner

*Primary Examiner* — Lincoln Donovan
*Assistant Examiner* — David Mattison
(74) *Attorney, Agent, or Firm* — Patterson & Sheridan, L.L.P.

(57) ABSTRACT

Certain aspects of the present disclosure provide methods and apparatus (e.g., a level shifter) for buffering an oscillating signal generated by an oscillator. One example apparatus generally includes an amplifier having a first amplification stage configured to amplify the oscillating signal generated by the oscillator and a second amplification stage configured to amplify an inverse of the oscillating signal generated by the oscillator; and a sensing circuit configured to adjust an operational bandwidth of the amplifier based on a frequency of the oscillating signal.

30 Claims, 9 Drawing Sheets

FIG. 7A Current mode sensing

FIG. 7B Voltage mode sensing

WIDE FREQUENCY/VOLTAGE-RATIO BUFFER WITH ADAPTIVE POWER CONSUMPTION

TECHNICAL FIELD

Certain aspects of the present disclosure generally relate to electronic circuits and, more particularly, to apparatus (e.g., voltage level-shifting circuits) for buffering an oscillating signal to adjust the amplitude thereof.

BACKGROUND

As the minimum feature size of integrated circuits (ICs) continues to shrink and the desire for reduced power consumption persists, the core logic section of digital circuits are being supplied from ever-decreasing voltages, such as down to 1.0 V or lower. However, the power supply voltages of other sections of the IC (e.g., the input/output (I/O) section) may remain at higher voltage levels, such as 1.8 V, 2.5 V, 3.3 V, or higher. These higher voltage levels may be used to interface with other logic types or to assure compatibility with other devices. Therefore, a voltage level shifter may be used to level shift a signal from a relatively low supply voltage to a relatively high supply voltage or vice versa.

Voltage level shifters are used in many applications as the interface between low and high voltage control or clock signals. These applications include analog-to-digital converters (ADCs), digital-to-analog converters (DACs), clock level shifters, and any other high-speed interface with multiple supply voltages. An ideal level shifter shifts the input signal to a different level and connects the two interfaces together without any issues, such that the impact of the level shifter is almost negligible. However, conventional level shifters may have high latency, inconsistent performance over various combinations of the voltage levels' extremes, and/or distorted duty cycle in high-speed interface applications.

SUMMARY

Certain aspects of the present disclosure generally relate to apparatus (e.g., voltage level-shifting circuits) for buffering an oscillating signal to adjust the amplitude thereof despite changes in frequency. By sensing the frequency of the oscillating signal, the apparatus may perform dynamic power adjustment (e.g., by adaptively adjusting a bias current based on the frequency).

Certain aspects of the present disclosure provide an apparatus for buffering an oscillating signal generated by an oscillator. The apparatus generally includes an amplifier and a sensing circuit configured to adjust an operational bandwidth of the amplifier based on a frequency of the oscillating signal. The amplifier generally includes a first amplification stage configured to amplify the oscillating signal generated by the oscillator and a second amplification stage configured to amplify an inverse of the oscillating signal generated by the oscillator.

Certain aspects of the present disclosure provide a method for buffering an oscillating signal generated by an oscillator. The method generally includes adjusting an operational bandwidth of an amplifier based on a frequency of the oscillating signal, amplifying the oscillating signal via a first amplification stage of the amplifier, and amplifying an inverse of the oscillating signal via a second amplification stage of the amplifier, wherein the amplified inverse of the oscillating signal is used to drive at least a portion of the first amplification stage.

Certain aspects of the present disclosure provide an apparatus for buffering an oscillating signal generated by means for generating the oscillating signal. The apparatus generally includes means for amplifying the oscillating signal and means for adjusting an operational bandwidth of the means for amplifying based on a frequency of the oscillating signal. The means for amplifying the oscillating signal generally include first means for amplifying configured to amplify the oscillating signal and second means for amplifying configured to amplify an inverse of the oscillating signal, wherein the amplified inverse of the oscillating signal is used to drive at least a portion of the first means for amplifying.

Certain aspects of the present disclosure provide a level shifter for adjusting an amplitude of an oscillating signal generated by an oscillator. The level shifter generally includes a first amplifier circuit configured to amplify the oscillating signal, wherein an operational bandwidth of the first amplifier circuit is adjusted based on a frequency of the oscillating signal; a current sensing circuit configured to sense a current input to the oscillator and output a bias current for the first amplifier circuit based on the sensed input current; and a latch circuit configured to level shift the amplitude of the amplified oscillating signal.

Certain aspects of the present disclosure provide a method for level shifting an amplitude of an oscillating signal generated by an oscillator. The method generally includes adjusting an operational bandwidth of a first amplifier based on a frequency of the oscillating signal by sensing a current input to the oscillator and outputting a bias current for the first amplifier based on the sensed input current, amplifying the oscillating signal via the first amplifier, and level shifting the amplitude of the amplified oscillating signal.

Certain aspects of the present disclosure provide an apparatus for level shifting an amplitude of an oscillating signal generated by means for generating the oscillating signal. The apparatus generally includes means for amplifying the oscillating signal, means for adjusting an operational bandwidth of the means for amplifying based on a frequency of the oscillating signal by sensing a current input to the oscillator and outputting a bias current for the means for amplifying based on the sensed input current, and means for level shifting the amplitude of the amplified oscillating signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
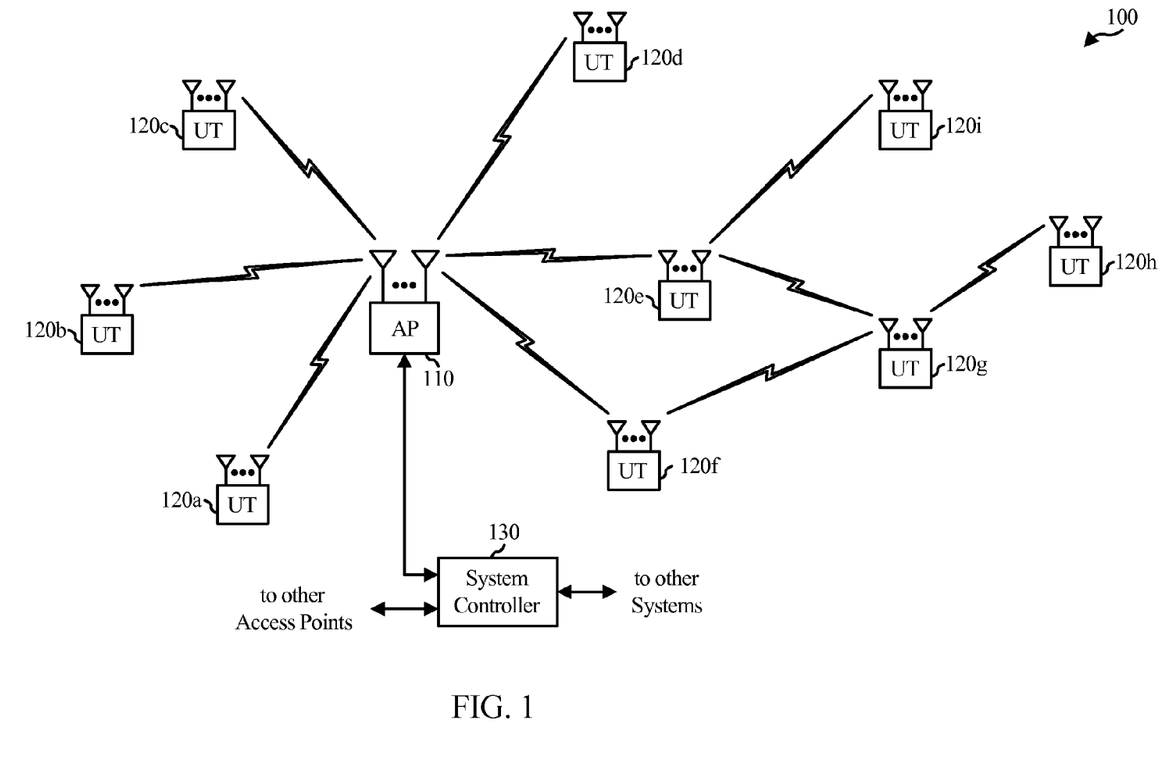
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more frequency synthesizers to generate periodic signals used for signal transmission and/or reception. The frequency synthesizers may include a voltage-controlled oscillator (VCO) and a buffer (e.g., a level shifter). In certain aspects of the present disclosure, an operational bandwidth of the buffer may be adjusted based on a frequency of an oscillating signal generated by the VCO.

Figure 2:
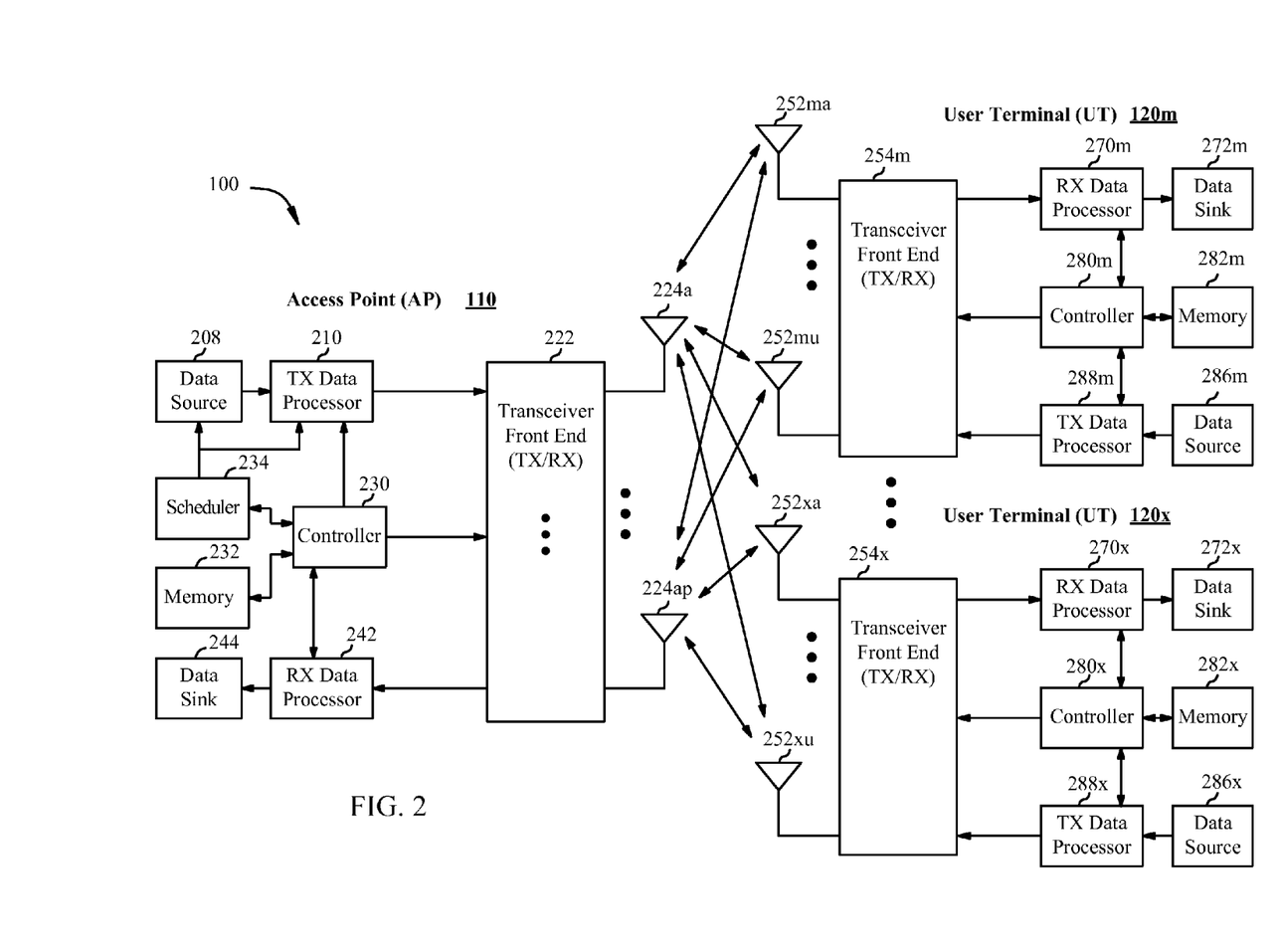
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224*a* through 224*ap* receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more frequency synthesizers to generate periodic signals used for signal transmission and/or reception. The frequency synthesizers may include a VCO and a buffer (e.g., a level shifter). In certain aspects of the present disclosure, an operational bandwidth of the buffer may be adjusted based on a frequency of an oscillating signal generated by the VCO.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
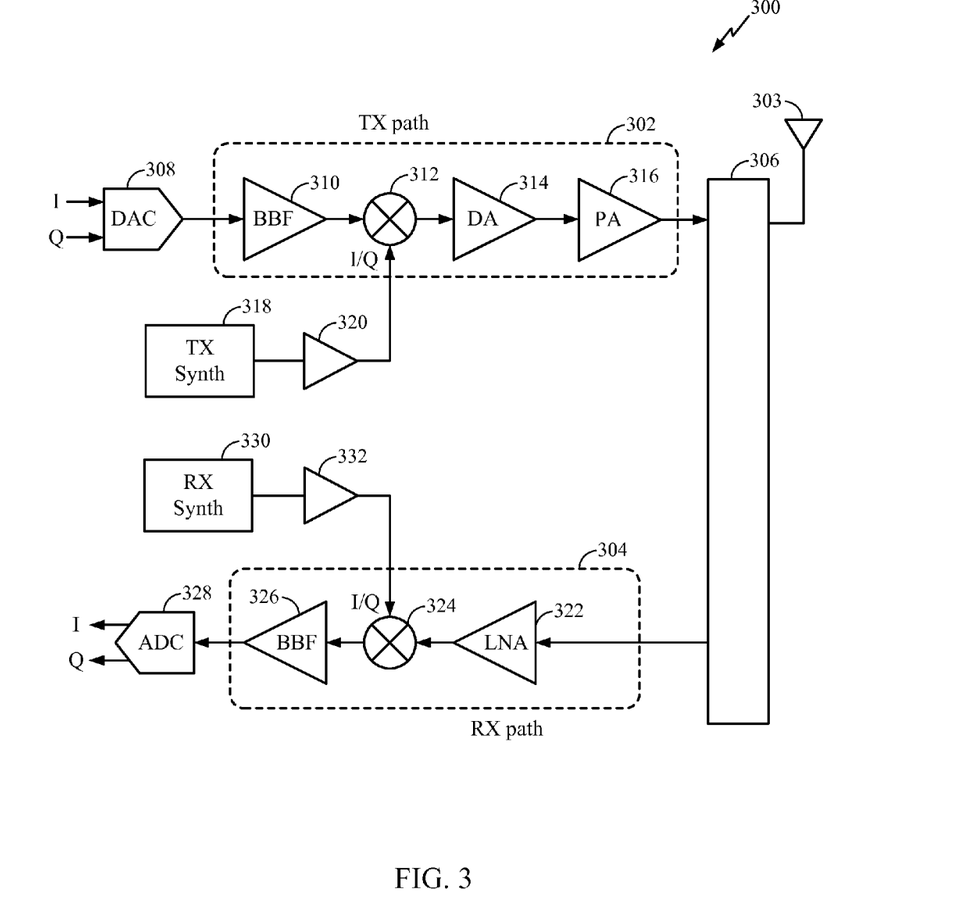
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Level-Shifting Circuits

Voltage level-shifting circuits (or level shifters) are used in many applications as the interface between low and high voltage control or clock signals. These applications include voltage-controlled oscillators (VCOs), analog-to-digital converters (ADCs) (e.g., used for temperature sensors), digital-to-analog converters (DACs), clock level shifters, and any other high-speed interface with multiple supply voltages.

Figure 4:
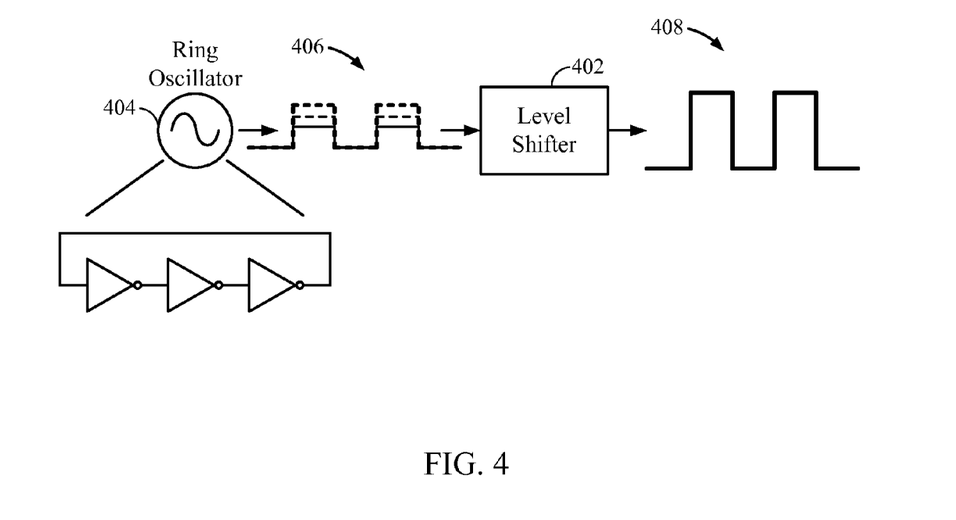
FIG. 4 illustrates an example level shifter configured to level shift an output signal of voltage-controlled oscillator (VCO), according to certain aspects of the present disclosure.

FIG. 4 illustrates an example level shifter 402 configured to level shift an output signal of VCO 404, according to certain aspects of the present disclosure. As illustrated, the VCO 404 may be implemented as a ring oscillator with a plurality of inverters connected in series, where an output of the last inverter in the series is fed back to an input of the first inverter to form a loop. The VCO 404 may generate an oscillating signal 406; however, the amplitude of the oscillating signal 406 may vary due to several factors that influence the VCO 404 output, such as variability in the supply voltage and/or the tuning voltage for the VCO 404. The amplitude of the oscillating signal 406 may also be a function of frequency, with higher frequencies having higher amplitude, for example. Thus, the level shifter 402 may be used to buffer the oscillator signal 406 and generate an oscillating signal 408 having a constant amplitude.

Figure 5:
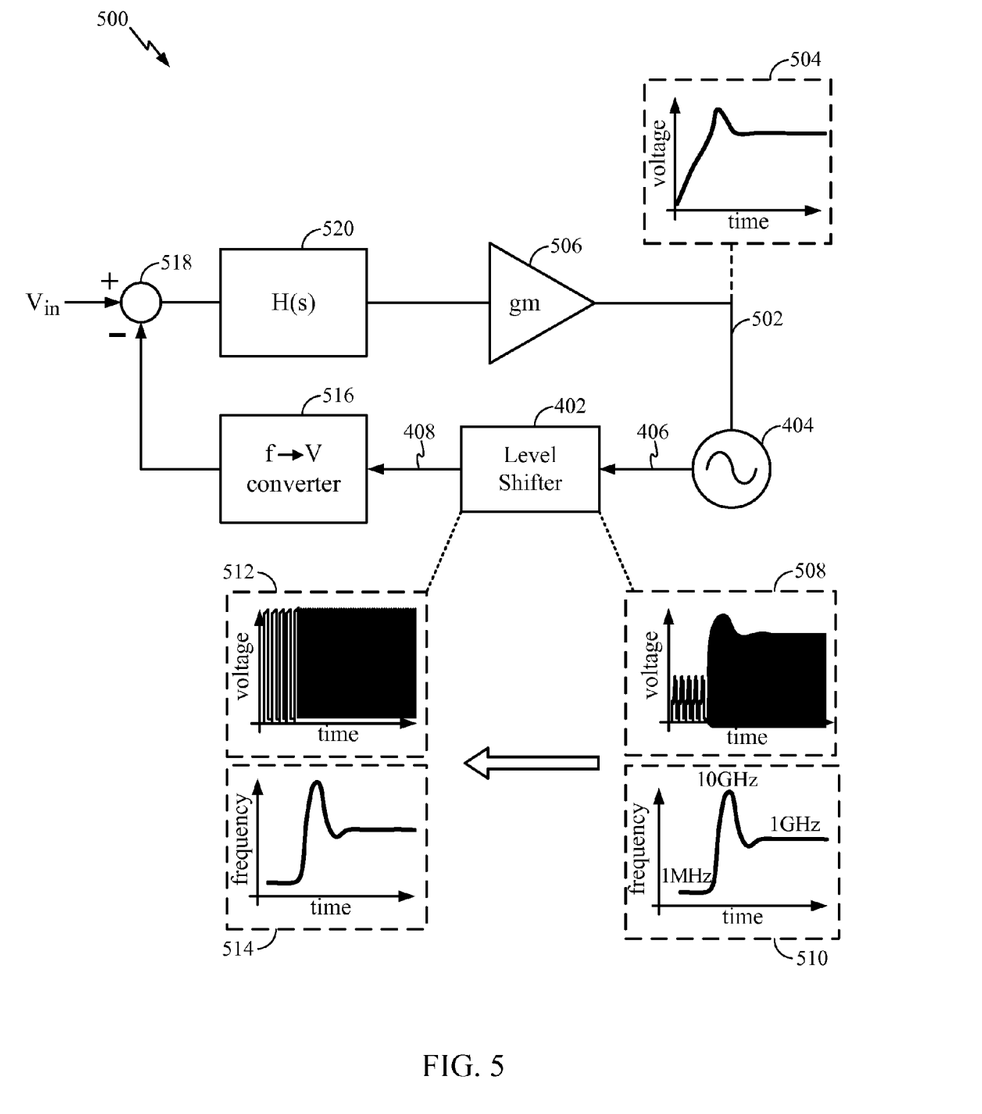
FIG. 5 is a block diagram of an example closed feedback loop for a VCO, according to certain aspects of the present disclosure.

FIG. 5 is block diagram of an example closed feedback loop 500 for the VCO 404, according to certain aspects of the present application. As illustrated, frequency of the oscillating signal 406 generated by the VCO 404 may be adjusted based on a tuning voltage 502 input to the VCO 404. However, due to loop settling dynamics that result in variability in the tuning voltage output by the amplifier 506, the frequency of the oscillating signal 406 output by the VCO 404 can vary transiently during frequency changes. That is, as illustrated by graph 504, the tuning voltage 502 may rise to a peak voltage and eventually settle at a nominal voltage level that is lower than the peak voltage. This characteristic of the tuning voltage directly affects the oscillating signal 406 output by the VCO 404. For example, the amplitude of the oscillating signal 406 may have a peak voltage higher than the oscillating signal's nominal voltage amplitude, as illustrated by graph 508. Moreover, the frequency of the oscillating signal may temporarily rise to a maximum frequency (e.g., 10 GHz) that is higher than a desired/intended/selected frequency (e.g., 1 GHz) of the oscillating signal 406, as illustrated by graph 510. As shown, in tuning the VCO 404 from 1 MHz to 1 GHz, 1 MHz output signals will have a different amplitude than the 1 GHz output signals.

As a result, it may be desirable to design a level shifter that can operate at the highest expected frequency of the oscillating signal 406. Otherwise, if the frequency of an input signal to the level shifter increases past the operational bandwidth of the level shifter, the level shifter may not output an oscillating signal, which may cause instability in the feedback loop 500 of the VCO.

In addition, the input signal (e.g., the oscillating signal 406) to the level shifter may have a low voltage level (e.g., at 1 MHz). Thus, the level shifter may include an amplifier to amplify the input signal that is to be level shifted. However, designing the amplifier of the level shifter to handle the highest expected frequency of the oscillating signal 406 may result in increased power consumption by the amplifier, and as a result, increased power consumption by the level shifter. Thus, what is needed is a level shifter that can handle a wide variation in the input frequency and sub-threshold input voltage amplitudes with reduced power consumption.

Aspects of the present disclosure provide a level shifter having an amplifier that adaptively adjusts the shifter's operational bandwidth, and thus adjusts the shifter's power consumption, based on an expected frequency of an input (e.g., oscillating signal 406) to the level shifter. Thus, the level shifter 402 may generate a constant amplitude oscillating signal 408 that tracks the frequency of oscillating signal 406 output by the VCO 404, as illustrated by graphs 512 and 514, with reduced power consumption.

The constant amplitude oscillating signal 408 of the level shifter 402 may be sent to a frequency-to-voltage converter 516 to generate an analog voltage signal that is representative of the frequency of the oscillating signals 406 and 408. The voltage output from the converter 516 may be compared to a voltage (Vin) representing a desired frequency (e.g., the output of a charge pump in a PLL) by subtracting the output of the converter 516 from Vin at a summing point 518 (e.g., implemented with a differential amplifier) for negative feedback. The difference may be sent to a filter 520 (e.g., with transfer function H(s)) and transconductance amplifier 506 and used to control the VCO such that the frequency of the oscillating signal output from the VCO equals the desired frequency.

Figure 6:
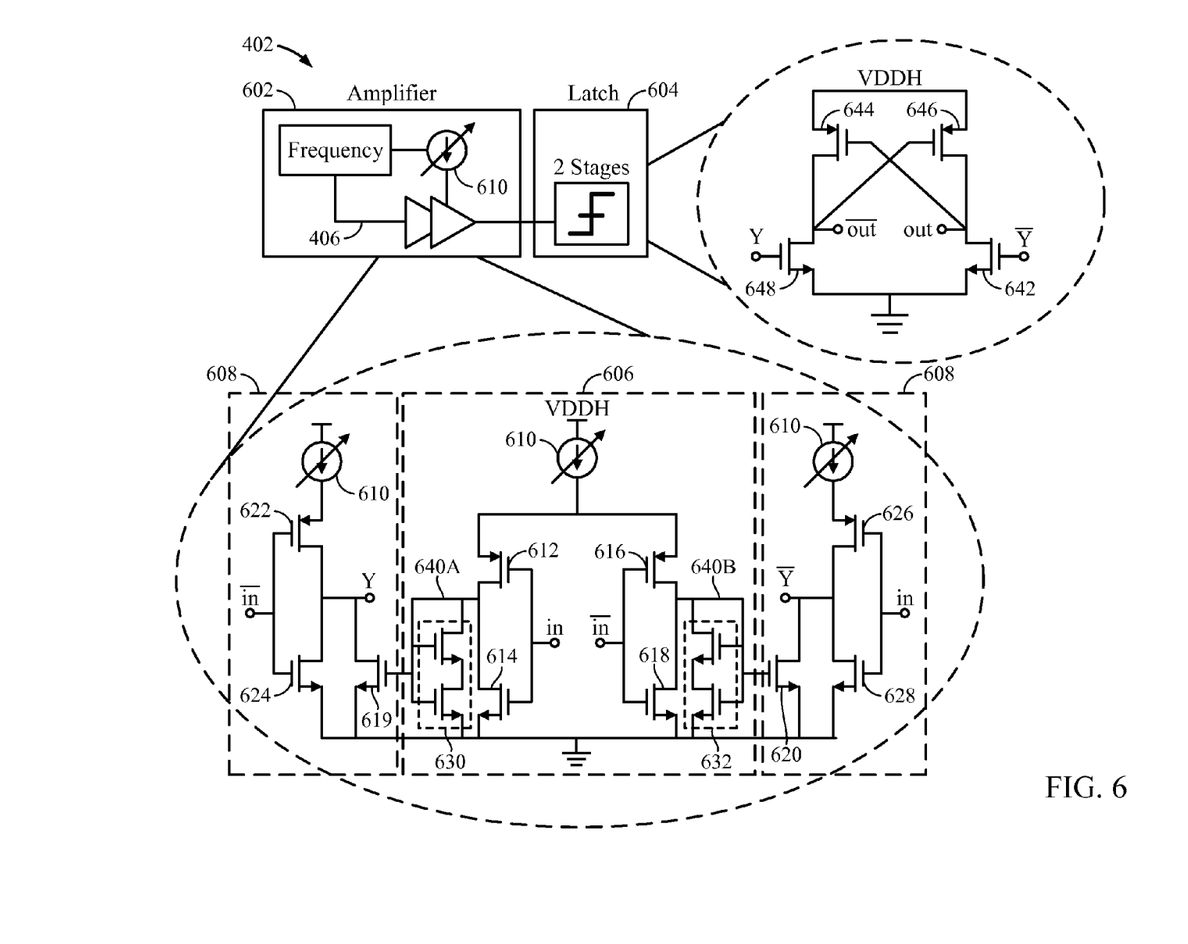
FIG. 6 illustrates an example level shifter including an amplifier circuit and a latch circuit, according to certain aspects of the present disclosure.

FIG. 6 illustrates an example level shifter 402 including an amplifier circuit 602 and a latch circuit 604, according to certain aspects of the present disclosure. The amplifier circuit 602 may include a first amplifier 606 and a second amplifier 608. The amplifier circuit 602 may be biased using a variable current source 610 that may be adjusted based on a sensed frequency of the input signal 406 to the level shifter 402.

As illustrated, the amplifier circuit 602 may include a first amplifier 606 (e.g., a pre-amplifier) biased by the variable current source 610. The first amplifier 606 may include a transistor 612 (e.g., p-channel metal-oxide-semiconductor (PMOS) transistor) connected in cascode with a transistor 614 (e.g., n-channel metal-oxide-semiconductor (NMOS) transistor). The gates of the transistors 612, 614 may be driven by the input oscillating signal 406 (labeled "in"). Moreover, the first amplifier 606 also includes cascode-connected transistors 616 (e.g., PMOS transistor) and 618 (e.g., NMOS transistor), the gates of which are driven by an inverse of the input oscillating signal 406 (labeled "$\overline{\text{in}}$") in a differential configuration. Thus, output nodes 640A, 640B of the first amplifier 606 are used to drive the gates of NMOS transistors 619, 620 of the second amplifier 608, respectively.

As illustrated, the second amplifier 608 also includes cascode-connected transistors 622, 624, driven by the inverse of the input oscillating signal 406 ($\overline{\text{in}}$) (e.g., the complementary signal of a differential oscillating signal pair), and cascode-connected transistor 626, 628, driven by the input oscillating signal 406 (in). The NMOS transistors 619, 620 are connected in parallel with NMOS transistors 624, 628, respectively, and may help to pull down (e.g., decrease) the voltage at output nodes Y and $\overline{\text{Y}}$ when transistor 624 or transistor 628 is activated (e.g., electrically coupling respective output nodes Y and $\overline{\text{Y}}$ to the reference potential). Moreover, the amplifier 608 is also biased using the variable current source 610.

Therefore, by biasing the amplifier circuit 602 based on a frequency of the oscillating signal input to the level shifter 402, the speed (e.g., operational bandwidth) of the amplifier circuit 602 may be adjusted accordingly. That is, the amplifier consumes increased power when the frequency of the input oscillating signal 406 increases. The power consumed by the amplifier decreases along with decreased frequency of the input oscillating signal 406. Therefore, the level shifter 402 may consume less power during operation.

In certain aspects, the output nodes 640A, 640B of the first amplifier 606 may be coupled to voltage-limiting circuits 630, 632, respectively, configured to limit a voltage at the output nodes 640A, 640B. In certain aspects, the voltage-limiting circuit 630 may include cascode-connected transistors configured to form a diode between nodes 640A, 640B and the reference potential. The voltages at output nodes 640A, 640B may be limited based on characteristics of the NMOS transistors 619, 620 (e.g., maximum drive voltage of gates of transistors 619, 620).

In certain aspects, the variable current source 610 may be a single current source, or multiple current sources, each configured to bias a respective amplifier of the first and second amplifiers 606, 608.

The output of the second amplifier 608 (e.g., at output nodes Y and V) may be connected with a latch circuit. For example, the output nodes Y and V may be used to drive the gates of NMOS transistors 648, 642, which are coupled to cross-coupled transistors 644, 646. Thus, the output nodes at the drains of transistors 648, 642 may be used as the outputs of the level shifter 402.

Figure 7A:
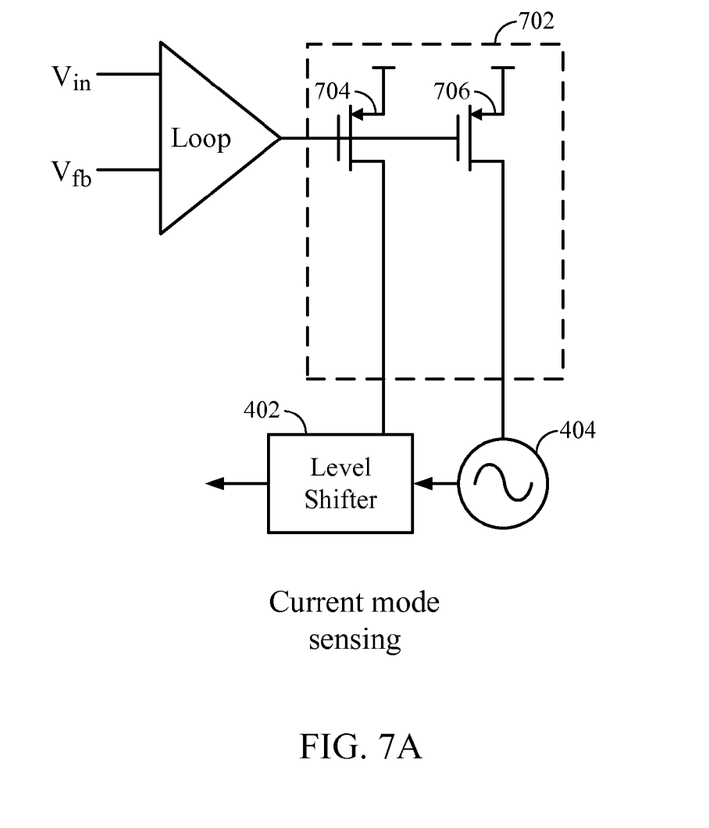
FIG. 7A illustrates an example current-mode sensing technique used to control the bias current of the level shifter, according to certain aspects of the present disclosure.

FIG. 7A illustrates an example current-mode sensing technique used to control the bias current of the level shifter 402, according to certain aspects of the present disclosure. As illustrated, a current mirror circuit 702 may be used to sense an input current to the VCO, and mirror (or generate a scaled version of) the input current to the VCO to drive the level shifter 402 (e.g., use the mirrored current to bias the amplifiers 606, 608). That is, the input current to the VCO is representative of the output signal frequency of the VCO 404 because the VCO 404 consumes more current at higher output frequencies. In certain aspects, the current mirror circuit 702 may include a transistor 704 and a transistor 706. The gates of transistors 704 and 706 may be coupled together and driven using the feedback loop described with respect to FIG. 5. Therefore, the drain-to-source current (Ids) of transistor 704 matches the Ids of transistor 706. Thus, the level shifter 402 is biased based on the input current to the VCO 404, and as a result, based on the output frequency of the VCO 404.

In certain aspects, the current sensing may include a current mirror circuit configured to mirror a portion of the input current to the VCO. That is, the mirrored current may be less than the input current to the VCO, yet still vary based on the input current to the VCO. In other aspects, the mirrored current may be more than the input current to the VCO, yet still vary based on the input current to the VCO. In other words, the current mirror circuit 702 may have a generated-to-sensed current ratio of 1:1 for certain aspects, while other aspects may have a different current ratio.

Figure 7B:
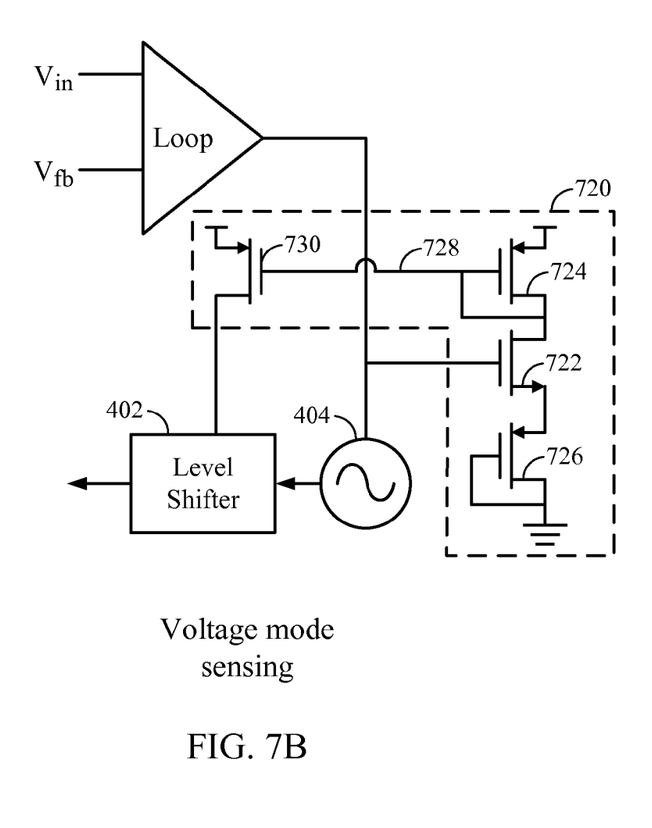
FIG. 7B illustrates an example voltage-mode sensing technique used to control the bias current of the level shifter, according to certain aspects of the present disclosure.

FIG. 7B illustrates an example voltage-mode sensing technique used to control the bias current of the level shifter 402, according to certain aspects of the present disclosure. As illustrated, a voltage-sensing circuit 720 may be used to sense the input voltage (tuning voltage) to the VCO (e.g., driven using feedback loop 500 described with respect to FIG. 5) and bias the level shifter 402 based on the sensed voltage. In certain aspects, the voltage-sensing circuit 720 may include an NMOS transistor 722 configured to sense the input voltage to the VCO. That is, the gate of transistor 722 may be coupled to the tuning input of the VCO 404. Thus, the Ids of transistor 722 is controlled (e.g., adjusted) based on the input voltage to the VCO 404. The Ids of transistor 722 also flows from source to drain of PMOS transistor 724 and source to drain of PMOS transistor 726. Transistors 724 and 730 may function as a current mirror. Therefore, the Ids of transistor 730 used to bias the level shifter 402 varies based on the Ids of transistor 724, controlled by the voltage at the gate of transistor 722.

Figure 8:
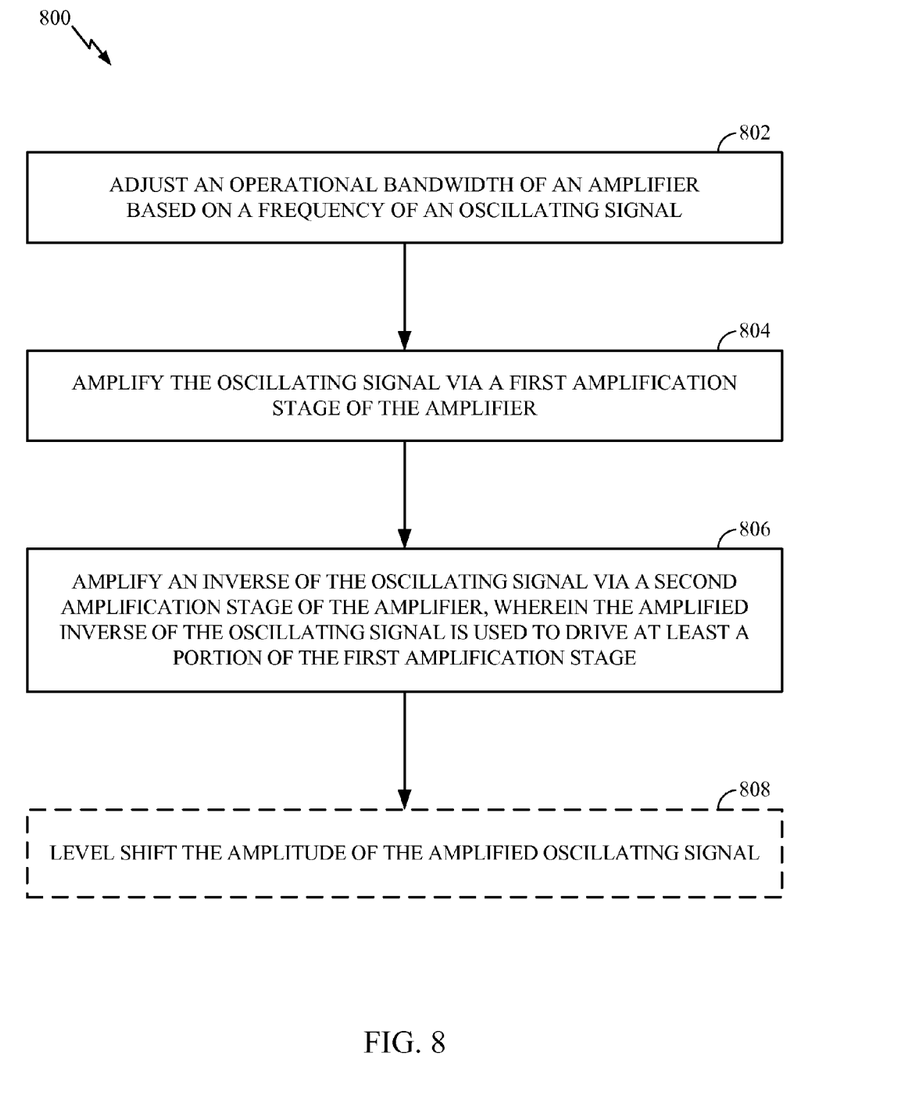
FIG. 8 is a flow diagram of example operations for buffering an oscillating signal generated by an oscillator, in accordance with certain aspects of the present disclosure.

FIG. 8 is a flow diagram of example operations 800 for buffering an oscillating signal generated by an oscillator, in accordance with certain aspects of the present disclosure. The operations 800 may be performed by an apparatus including one or more circuits, such as a level-shifting circuit (e.g., level shifter 402 of FIG. 6) and/or a sensing circuit as illustrated in FIG. 7A or 7B.

The operations 800 may begin, at block 802, with the apparatus adjusting an operational bandwidth of an amplifier based on a frequency of the oscillating signal. At block 804, the apparatus amplifies the oscillating signal via a first amplification stage of the amplifier. At block 806, the apparatus amplifies an inverse of the oscillating signal via a second amplification stage of the amplifier. The amplified inverse of the oscillating signal may be used to drive at least a portion of the first amplification stage.

In certain aspects, adjusting the operational bandwidth of the amplifier at block 802 involves adjusting an output switching speed of the amplifier.

In certain aspects, the operations 800 further include adjusting a sourced current based on the frequency of the oscillating signal and biasing at least one of the first amplification stage or the second amplification stage using the adjusted sourced current.

In certain aspects, the operations 800 further entail sensing a current input to the oscillator and outputting a bias current for at least one of the first amplification stage or the second amplification stage based on the sensed input current. For other aspects, the operations 800 further involve sensing a voltage input to the oscillator, wherein the frequency of the oscillating signal is adjusted based on the sensed input voltage, and adjusting a current used to bias at least one of the first amplification stage or the second amplification stage based on the sensed input voltage.

In certain aspects, the operations 800 further include level shifting the amplitude of the amplified oscillating signal at optional block 808. In certain aspects, the at least a portion of the first amplification stage includes a first transistor, the first amplification stage includes a second transistor connected in cascode with a third transistor, and a gate of the second transistor and a gate of the third transistor are coupled to the oscillator for receiving the oscillating signal. In this case, level shifting the amplitude of the amplified oscillating signal at block 808 entails level shifting the amplitude based on a voltage at a node connected to a drain of the second transistor and a drain of the third transistor. In certain aspects, the second amplification stage includes a fourth transistor connected in cascode with a fifth transistor, a gate of the fourth transistor and a gate of the fifth transistor are coupled to the oscillator and configured to receive the inverse of the oscillating signal generated by the oscillator, and an output of the second amplification stage is at a node connected to at least one of a drain of the fourth transistor or a drain of the fifth transistor. In certain aspects, the operations 800 further include limiting a voltage of an output of the second amplification stage with a voltage-limiting circuit connected between the gate of the first transistor and a source of the first transistor.

Figure 9:
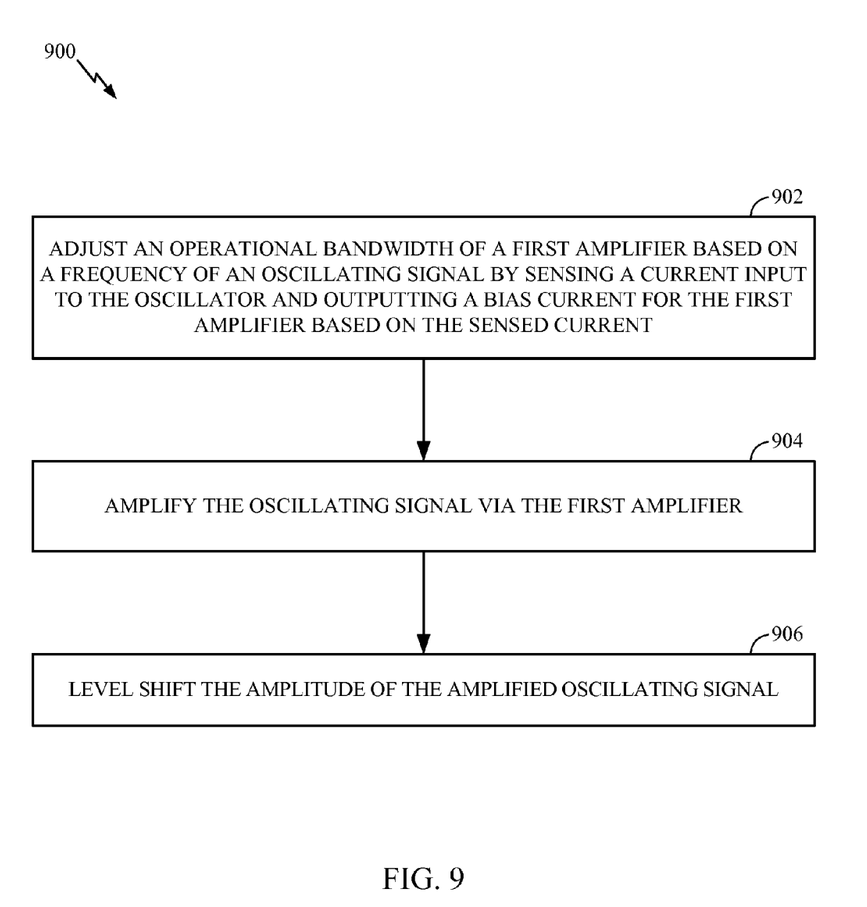
FIG. 9 is a flow diagram of example operations for level shifting an amplitude of an oscillating signal generated by an oscillator, in accordance with certain aspects of the present disclosure.

FIG. 9 is flow diagram of example operations 900 for level shifting an amplitude of an oscillating signal generated by an oscillator, in accordance with certain aspects of the present disclosure. The operations 900 may be performed by an apparatus including one or more circuits, such as the level shifter 402 of FIG. 6 and the current mirror circuit 702 of FIG. 7A.

The operations 900 may begin, at block 902, by adjusting an operational bandwidth of a first amplifier based on a frequency of the oscillating signal by sensing a current input to the oscillator and outputting a bias current for the first amplifier based on the sensed input current. At block 904, the apparatus amplifies the oscillating signal via the first amplifier. At block 906, the apparatus level shifts the amplitude of the amplified oscillating signal.

In certain aspects, the first amplifier includes a first transistor connected in cascode with a second transistor, a gate of the first transistor and a gate of the second transistor are coupled to the oscillator for receiving the oscillating signal, and level shifting the amplitude of the amplified oscillating signal at block 906 involves level shifting the amplitude based on a voltage at a node connected to a drain of the first transistor and a drain of the second transistor. In certain aspects, the operations 900 further include driving a gate of a third transistor in the first amplifier using an output of a second amplifier, based on the frequency of the oscillating signal, wherein the third transistor is connected in parallel with the first transistor. In certain aspects, the second amplifier includes a fourth transistor connected in cascode with a fifth transistor, a gate of the fourth transistor and a gate of the fifth transistor are coupled to the oscillator and configured to receive an inverse of the oscillating signal generated by the oscillator, and the output of the second amplifier is at a node coupled to at least one of a drain of the fourth transistor or a drain of the fifth transistor.

In certain aspects, the operations 900 further include limiting a voltage of the output of the second amplifier with a voltage-limiting circuit connected between the gate of the third transistor and a source of the third transistor.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252$ma$ through 252$mu$ of the user terminal 120$m$ portrayed in FIG. 2, the antennas 224$a$ through 224$ap$ of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252$ma$ through 252$mu$ of the user terminal 120$m$ portrayed in FIG. 2, the antennas 224$a$ through 224$ap$ of the access point 110 illustrated in FIG. 2, or the antenna 303 of the transceiver front end 300 depicted in FIG. 3). Means for processing or means for determining may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2).

Means for adjusting, means for biasing, and/or means for outputting a bias current may comprise a current source, such as the current source 610 of FIG. 6 and/or a sensing circuit as described with reference to FIGS. 7A and 7B. Means for amplifying may comprise an amplifier, such as the amplifier 608 or amplifier 606 of FIG. 6. Means for level shifting may comprise a latch circuit, such as the latch circuit 604 of FIG. 6. Means for sensing may comprise a current sensing or voltage sensing circuit, such as the circuits 702 or 720 of FIGS. 7A and 7B. Means for limiting a voltage may comprise a voltage-limiting device or circuit such as the circuit 630 or circuit 632 of FIG. 6.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for buffering an oscillating signal generated by an oscillator, comprising:
    an amplifier comprising:
        a first amplification stage configured to amplify the oscillating signal generated by the oscillator and having an output coupled to a first transistor, wherein the first amplification stage comprises a second transistor connected with a third transistor, a gate of the second transistor and a gate of the third transistor coupled to the oscillator to receive the oscillating signal; and
        a second amplification stage configured to amplify an inverse of the oscillating signal generated by the oscillator, wherein an output of the second amplification stage is configured to drive the first transistor; and
    a sensing circuit configured to adjust an operational bandwidth of the amplifier based on a frequency of the oscillating signal.

2. The apparatus of claim 1, wherein the operational bandwidth of the amplifier is adjusted by adjusting an output switching speed of the amplifier.

3. The apparatus of claim 1, wherein the sensing circuit comprises a current source and is further configured to:
    adjust a current sourced by the current source based on the frequency of the oscillating signal; and
    bias at least one of the first amplification stage or the second amplification stage with the adjusted sourced current.

4. The apparatus of claim 1, wherein the sensing circuit comprises a current sensing circuit configured to sense a current input to the oscillator and to output a bias current for at least one of the first amplification stage or the second amplification stage based on the sensed input current.

5. The apparatus of claim 1, wherein:
    the sensing circuit comprises a voltage sensing circuit configured to sense a voltage input to the oscillator;
    the voltage sensing circuit is configured to adjust a bias current for at least one of the first amplification stage or the second amplification stage based on the sensed input voltage; and
    the frequency of the oscillating signal is adjusted based on the voltage input to the oscillator.

6. The apparatus of claim 1, further comprising a latch circuit configured to level shift an amplitude of the amplified oscillating signal.

7. The apparatus of claim 6, wherein:
    an
    the latch circuit is configured to level shift the amplified oscillating signal based on a voltage at a node connected to a drain of the second transistor and a drain of the third transistor.

8. The apparatus of claim 1, wherein the first transistor is connected in parallel with the second transistor.

9. The apparatus of claim 8, wherein:
    the second amplification stage comprises a fourth transistor connected with a fifth transistor;
    a gate of the fourth transistor and a gate of the fifth transistor are coupled to the oscillator and configured to receive the inverse of the oscillating signal generated by the oscillator; and
    the output of the second amplification stage is at a node connected to at least one of a drain of the fourth transistor or a drain of the fifth transistor.

10. The apparatus of claim 8, wherein the second amplification stage comprises a voltage-limiting circuit configured to limit a voltage of the output of the second amplification stage.

11. The apparatus of claim 1, wherein a periodic signal output by the latch circuit is configured to oscillate between a first voltage level and a second voltage level independent of the frequency of the oscillating signal.

12. A method for buffering an oscillating signal generated by an oscillator, comprising:
    adjusting an operational bandwidth of an amplifier based on a frequency of the oscillating signal;
    amplifying the oscillating signal via a first amplification stage of the amplifier;
    amplifying an inverse of the oscillating signal via a second amplification stage of the amplifier, wherein the amplified inverse of the oscillating signal is used to drive at least a portion of the first amplification stage, wherein the at least the portion of the first amplification stage comprises a first transistor, the first amplification stage comprising a second transistor connected with a third transistor, and wherein a gate of the second transistor and a gate of the third transistor are coupled to the oscillator for receiving the oscillating signal.

13. The method of claim 12, wherein adjusting the operational bandwidth of the amplifier comprises adjusting an output switching speed of the amplifier.

14. The method of claim 12, further comprising:
    adjusting a sourced current based on the frequency of the oscillating signal; and
    biasing at least one of the first amplification stage or the second amplification stage using the adjusted sourced current.

15. The method of claim 12, further comprising:
    sensing a current input to the oscillator; and
    outputting a bias current for at least one of the first amplification stage or the second amplification stage based on the sensed input current.

16. The method of claim 12, further comprising:
    sensing a voltage input to the oscillator, wherein the frequency of the oscillating signal is adjusted based on the sensed input voltage; and
    adjusting a current used to bias at least one of the first amplification stage or the second amplification stage based on the sensed input voltage.

17. The method of claim 12, further comprising level shifting an amplitude of the amplified oscillating signal.

18. The method of claim 17, wherein:
   level shifting the amplitude of the amplified oscillating signal comprises level shifting the amplitude based on a voltage at a node connected to a drain of the second transistor and a drain of the third transistor.

19. The method of claim 12, wherein:
   the second amplification stage comprises a fourth transistor connected in cascode with a fifth transistor;
   a gate of the fourth transistor and a gate of the fifth transistor are coupled to the oscillator and configured to receive the inverse of the oscillating signal generated by the oscillator; and
   an output of the second amplification stage is at a node connected to at least one of a drain of the fourth transistor or a drain of the fifth transistor.

20. The method of claim 12, further comprising limiting a voltage of an output of the second amplification stage with a voltage-limiting circuit connected between the gate of the first transistor and a source of the first transistor.

21. A level shifter for adjusting an amplitude of an oscillating signal generated by an oscillator, comprising:
   a first amplifier circuit configured to amplify the oscillating signal, wherein an operational bandwidth of the first amplifier circuit is adjusted based on a frequency of the oscillating signal, wherein the first amplifier circuit comprises a first transistor connected with a second transistor, and wherein a gate of the first transistor and a gate of the second transistor are coupled to the oscillator to receive the oscillating signal;
   a current sensing circuit configured to sense a current input to the oscillator and output a bias current for the first amplifier circuit based on the sensed input current; and
   a latch circuit configured to level shift the amplitude of the amplified oscillating signal.

22. The level shifter of claim 21, wherein:
   the latch circuit is configured to level shift the amplified oscillating signal based on a voltage at a node connected to a drain of the first transistor and a drain of the second transistor.

23. The level shifter of claim 21, further comprising a current source coupled to a source of the first transistor, wherein:
   a current output by the current source is adjusted based on the frequency of the oscillating signal; and
   the current output by the current source is used to bias the first amplifier circuit.

24. The level shifter of claim 21, further comprising a second amplifier circuit, wherein:
   the first amplifier circuit comprises a third transistor connected in parallel with the first transistor; and
   an output of the second amplifier circuit is coupled to a gate of the third transistor and is configured to drive the gate of the third transistor based on the frequency of the oscillating signal.

25. The level shifter of claim 24, wherein:
   the second amplifier circuit comprises a fourth transistor connected in cascode with a fifth transistor;
   a gate of the fourth transistor and a gate of the fifth transistor are coupled to the oscillator and configured to receive an inverse of the oscillating signal generated by the oscillator; and
   the output of the second amplifier circuit is at a node connected to at least one of a drain of the fourth transistor or a drain of the fifth transistor.

26. An apparatus for buffering an oscillating signal generated by means for generating the oscillating signal, comprising:
   means for amplifying the oscillating signal, comprising:
      first means for amplifying configured to amplify the oscillating signal; and
      second means for amplifying configured to amplify an inverse of the oscillating signal, wherein the amplified inverse of the oscillating signal is used to drive at least a portion of the first means for amplifying, wherein the at least the portion of the first means for amplifying comprising a first transistor, the first means for amplifying comprising a second transistor connected in cascode with a third transistor, and wherein a gate of the second transistor and a gate of the third transistor are coupled to the means for generating the oscillating signal for receiving the oscillating signal; and
   means for adjusting an operational bandwidth of the means for amplifying based on a frequency of the oscillating signal.

27. The apparatus of claim 26, wherein the means for adjusting further comprises:
   means for adjusting a sourced current based on the frequency of the oscillating signal; and
   means for biasing at least one of the first means for amplifying or the second means for amplifying using the adjusted sourced current.

28. The apparatus of claim 26, wherein the means for adjusting further comprises:
   means for sensing a current input to the means for generating the oscillating signal; and
   means for outputting a bias current for at least one of the first means for amplifying or the second means for amplifying based on the sensed input current.

29. The apparatus of claim 26, wherein the means for adjusting further comprises:
   means for sensing a voltage input to the means for generating the oscillating signal, wherein the frequency of the oscillating signal is adjusted based on the sensed input voltage; and
   means for adjusting a current used to bias at least one of the first means for amplifying or the second means for amplifying based on the sensed input voltage.

30. The apparatus of claim 26, further comprising means for level shifting an amplitude of the amplified oscillating signal.

* * * * *